HIGH REPETITION RATE PULSE GENERATOR USING AVALANCHE TRANSISTOR TO DISCHARGE AND BLOCKING OSCILLATOR TO RECHARGE CAPACITOR

Filed June 27, 1960 2 Sheets-Sheet 1

INVENTOR.
JOHANN G. DILL,
BY
Walter J. Adam
ATTORNEY.

HIGH REPETITION RATE PULSE GENERATOR USING AVALANCHE TRANSISTOR TO DISCHARGE AND BLOCKING OSCILLATOR TO RECHARGE CAPACITOR

Filed June 27, 1960 2 Sheets-Sheet 2

INVENTOR.
JOHANN G. DILL,
BY
Walter J. Adam
ATTORNEY

United States Patent Office 3,017,519

Patented Jan. 16, 1962

3,017,519

HIGH REPETITION RATE PULSE GENERATOR USING AVALANCHE TRANSISTOR TO DISCHARGE AND BLOCKING OSCILLATOR TO RECHARGE CAPACITOR

Johann G. Dill, Costa Mesa, Calif., assignor to Hughes Aircraft Company, Culver City, Calif., a corporation of Delaware Filed June 27, 1960, Ser. No. 38,984
10 Claims. (Cl. 307—88.5)

This invention relates to pulse generating circuits and particularly to an improved pulse generator utilizing avalanche transistors and having a high pulse repetition rate.

Pulse generators conventionally require a plurality of components such as transistors or tubes and have the disadvantage of having a slow response time. In order to form relatively wide pulses of a desired width in response to a narrow trigger pulse, additional integrating circuitry is generally required to provide feedback operation. A simplified means to form pulses in response to a trigger signal is in the utilization of avalanche transistors which characteristically develop a large current pulse after the application of a trigger signal. Avalanche transistors conventionally after breakdown and internal regenerative feedback operation has started, continue to conduct independently of the trigger signal, that is, similar to a thyratron. Thus, avalanche transistors may be utilized to develop pulses with a minimum of circuitry. Also, the slow response time of conventional pulse generators is overcome by the fast response of the avalanche multiplication operation in transistors.

Pulse generators utilizing avalanche transistors triggered at the base required a storage capacitor coupled in the load current path for limiting the current passing therethrough when forming the output pulse so as to prevent damage to the transistor. The transistor is biased to an avalanche operating point by a power supply and biasing resistor coupled respectively in series to a point between the capacitor and the transistor. The capacitor recharges after the formation of an output pulse by current flowing through the biasing resistor from the power supply. However, the pulse repetition rate of the generator is greatly limited by the time necessary to recharge the storage capacitor through the biasing resistor. The value of the biasing resistor must be relatively large because the operating requirements of the transistor require that the biasing potential at the operating point be maintained substantially constant. A pulse forming circuit utilizing avalanche transistors that has a rapid recovery time so as to form pulses at a high repetition rate would be very advantageous to the art.

It is, therefore, an object of this invention to provide a pulse generator for developing relatively narrow pulses at a high repetition rate.

It is another object of this invention to provide a simplified pulse generator utilizing an avalanche transistor and capacitive storage means that includes an arrangement to overcome the slow recharge time of the capacitive means.

It is a further object of this invention to provide a circuit for recharging the storage capacitor utilized with an avalanche transistor that automatically responds to the pulses generated thereby to provide rapid recharging of the capacitor.

Briefly, this invention is a pulse generator with a high repetition rate including an avalanche transistor in a grounded emitter configuration responding at its base to trigger pulses. The collector of the avalanche transistor is coupled through a first storage capacitor to an output terminal, the first capacitor discharging through the avalanche transistor, when triggered into conduction, to develop output pulses. Also, the collector is coupled to a source of potential of power source through both a biasing resistor and a controlled charging or recovery circuit. The charging circuit responds to a delayed output pulse to provide a low impedance current path between the collector of the avalanche transistor and the source of potential across a switching transistor. A second storage capacitor is coupled between the collector of the avalanche transistor and a transformer. The pulse developed by discharging the second storage capacitor through the avalanche transistor when triggered into conduction, is applied to the transformer and through a delay means to a control terminal of the switching transistor for recharging both capacitors at the termination of the output pulse. The circuit operates to rapidly recharge the capacitors to form output pulses at a high repetition rate.

The novel features of this invention, both as to its organization and method of operation, will best be understood from the accompanying description, taken in connection with the accompanying drawings, in which like reference characters refer to like parts, and in which.

Figure 1:
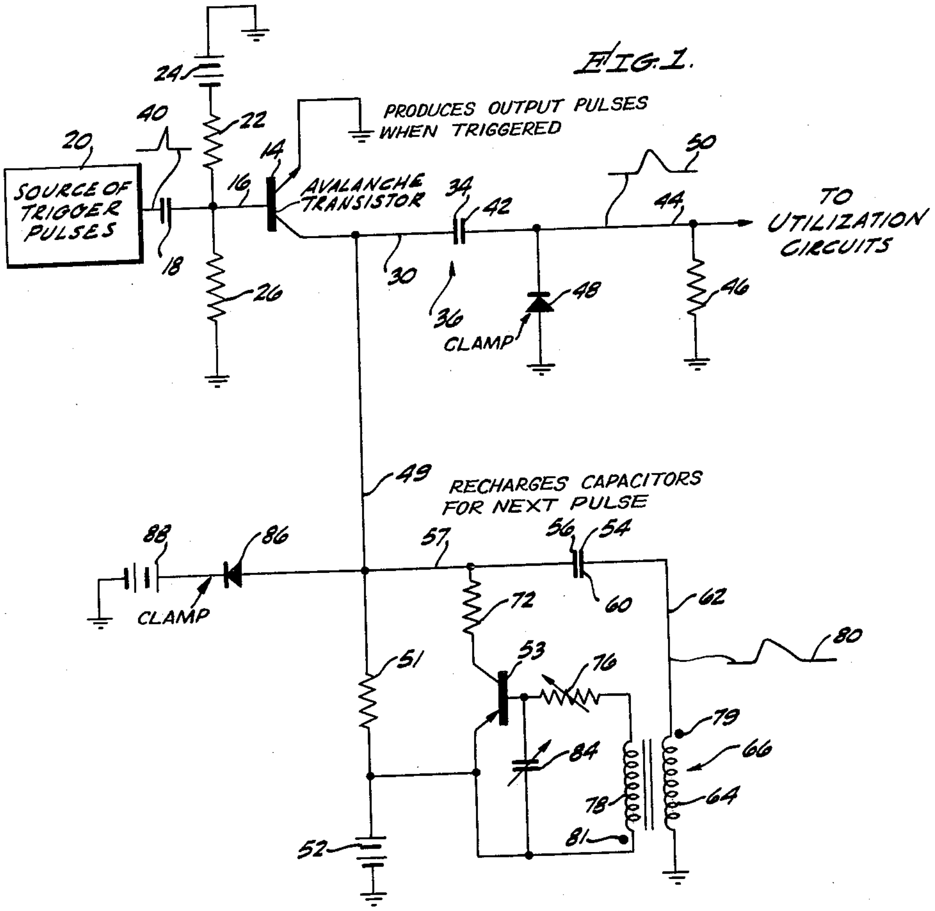
FIG. 1 is a schematic circuit diagram of the high repetition rate pulse generator in accordance with this invention.

Referring first to FIG. 1, the high repetition rate pulse generator in accordance with this invention includes a first transistor 14 of the n-p-n type with avalanche characteristics and having a base responsive through a lead 16 and a coupling capacitor 18 to a source of trigger pulses 20. The transistor 14 is an avalanche transistor having a relatively wide negative resistance region in which avalanche multiplication occurs when proper biasing potentials are applied thereto. As will be discussed in further detail subsequently, the transistor 14 is biased with a voltage at its collector close to a breakdown voltage and is maintained in a stable state by a reverse bias applied between its base and emitter. The reverse bias at the base is maintained by a voltage divider including a resistor 22 coupled between the negative terminal of a battery 24, having a grounded positive terminal, and the lead 16 which in turn is coupled through a resistor 26 to ground. The emitter of the avalanche transistor 14 may be grounded and the collector is coupled through a lead 30 to a first plate 34 of a storage capacitor 36 for limiting current through the transistor 14 when rendered conductive in response to a positive pulse of a waveform 40 applied to the base thereof. A second plate 42 of the capacitor 36 is coupled through a lead 44 to utilization circuits (not shown) which may include a grounded load resistor 46. The lead 44 is clamped through the cathode to anode path of a diode 48 to ground so as to eliminate oscillations at the termination of the output pulse of a waveform 50.

For biasing the collector of the transistor 14 in the negative resistance region, the lead 30 is coupled through a lead 49 and a biasing resistor 51 to the positive terminal of a battery 52, the negative terminal being grounded. The biasing resistor 51 has a relatively large value for limiting the steady state current through the transistor 14.

Because of the long time require to recharge the capacitor 36 during the period between pulses of the waveform 50, a recharging circuit is provided including a transistor 53 of the p-n-p type operating as a switch and a second storage capacitor 54. A first plate 56 of the capacitor 54 is coupled through a lead 57 and through the lead 49 to the lead 30 so as to operate in parallel with the capacitor 36 relative to the collector of the transistor 14. A second plate 60 of the capacitor 54 is coupled through a lead 62 to one end of a winding 64 of a transformer 66, the other end of the winding 64 being grounded.

The switching transistor 53 provides a low impedance current path from the battery 52 between the emitter and collector thereof through a current limiting resistor 72 to the lead 57 for rapidly recharging the capacitors 36 and 54 as well as for overcoming the carrier storage time of the transistor 14. The base of the transistor 52 is coupled through a timing resistor 76, which may be variable, to a first end of a second winding 78 of the transformer 66. The second end of the winding 78 is coupled to the positive terminal of the battery 52. The windings 64 and 78 of the transformer 66 have a polarity relation indicated by dots 79 and 81 such that pulses applied from the lead 62 to the base of the transistor 53 are inverted. For delaying the pulse of a waveform 80 on the lead 62 so that the transistor 52 is biased into conduction subsequent to the formation of the output pulse of the waveform 50, a control capacitor 84 is coupled between the base of the transistor 52 and the positive terminal of the battery 52, the capacitor 84 being of a variable type. A second clamping ararngement for limiting the voltage at the collector of the transistor 14 below the breakdown voltage when the capacitors 36 and 54 are being recharged is also provided, including a diode 86 having its anode to cathode path coupled between the lead 57 and the positive terminal of a battery 88, the negative terminal of which is grounded.

Figure 2:
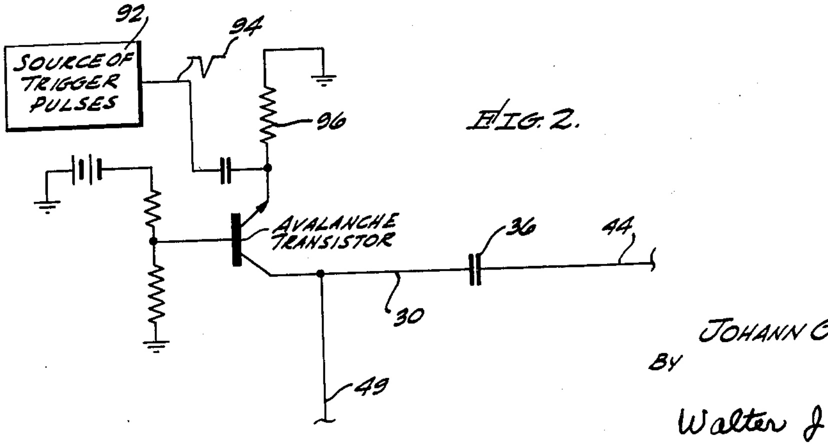
FIG. 2 is a schematic circuit diagram of a second switching arrangement for the avalanche transistor of FIG. 1.

Another arrangement in accordance with this invention as shown in FIG. 2 provides triggering of the transistor 14 from the emitter rather than from the base. A source of trigger pulses 92 applies negative trigger signals of a waveform 94 through a coupling capacitor 96 and directly to the emitter of the transistor 14. In order that the trigger signals are effective to forward bias the base to emitter junction of the transistor 14, the emitter is coupled through a resistor 96 to ground. Similar to the arrangement of FIG. 1 the collector of transistor 14 is coupled through the lead 30 to the capacitor 36 as well as being coupled through the lead 49 to the charging circuit as discussed in FIG. 1.

Figure 3:
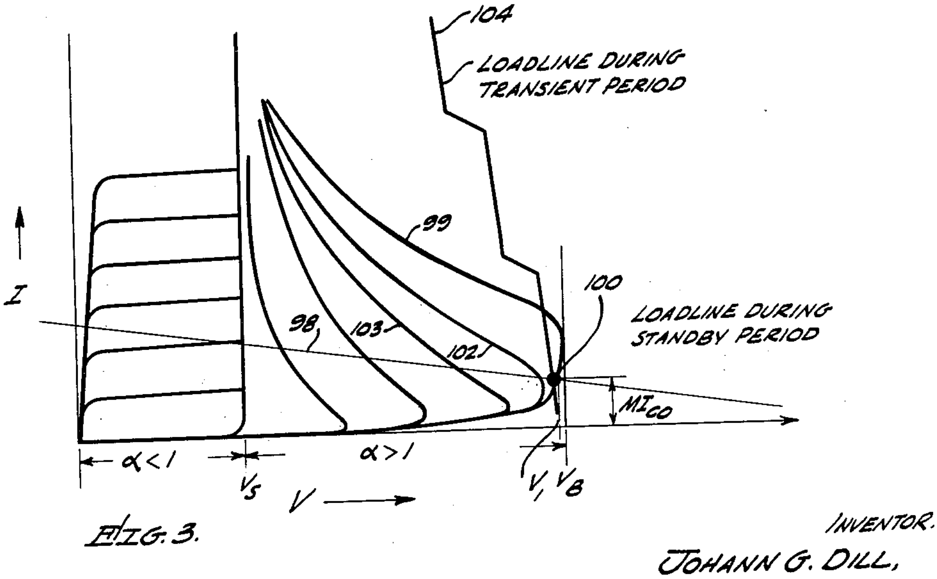
FIG. 3 is a graph of current versus voltage across the collector to emitter of the avalanche transistor of FIG. 1 showing the operating characteristics thereof as utilized in the circuit of FIG. 1.

Referring now to FIG. 3 the operating characteristics of the avalanche transistor 14 will be further explained. For the grounded emitter arrangement of the transistor 14, the voltage V at the X axis of the graph of FIG. 3 represents the potential maintained on the lead 30 and the current I of the Y axis of the graph represents the current flowing in the collector of the transistor 14. As is well known, the operating characteristics of a transistor may be either in a first region where $\alpha$, which is a ratio of collector to emitter current, is less than 1 indicating that the current through the collector is less than through the emitter. This first region is below a voltage $V_s$ at the collector which is the voltage at which the base current is compensated in the collector by an avalanche multiplication effect or current multiplication between the collector and emitter, at which voltage $\alpha$ equals 1. When the collector is biased higher than $V_s$ which is a second region of operation, avalanche multiplication causes more current to flow through the collector than flows through the emitter up to a breakdown voltage $V_B$ where the multiplication of collector to emitter current becomes essentially infinite. The operating region between the collector voltages $V_s$ and $V_B$ is a negative resistance region as $\alpha$ is greater than 1, that is, the current in the collector is greater than through the emitter.

In the avalanche multiplication operation when the transistor is biased between its collector and emitter in the avalanche region and the base to emitter path of the n-p-n type transistor 14 is forward biased, electrons or carriers travel from the emitter into the base and then to the collector to base junction which is a reverse biased junction where holes are produced. The collector to base junction is a high intensity field region and in response to the electrons produces hole-electron pairs by collision with the atoms of the crystal lattice and also ionize to produce additional electrons. The holes then are swept back toward the base-emitter junction to develop the hole-electron pairs in the base so that a regenerative feedback operation occurs. It is because of this avalanche multiplication that the current through the collector is greater than through the emitter. It is to be noted that for a p-n-p type transistor where the minority carriers transmitted from the emitter to base are holes, then the regenerative feedback operation is caused by electrons being swept back from the base to collector junction to the emitter to base junction to cause further hole-electron pairs to be developed in the base region.

The above avalanche multiplication operation in the transistor 14 is only initiated when the base to emitter junction is forward biased so that the electrons are able to travel from the emitter to the base of the transistor 14. Thus, the base of the transistor 14 is biased negative relative to the grounded emitter to prevent avalanche multiplication except during the occurrence of a positive trigger pulse of the waveform 40.

A loadline 98 for the circuit of FIG. 1 during the standby period has a very small slope from the horizontal because the resistor 68 has a relatively large value. A stable point 100 is selected on the loadline 98 and on characteristic negative resistance curve 99 at a voltage $V_1$ slightly below the breakdown voltage $V_B$ at which voltage steady state current $I_{co}$ times the multiplication factor M would become infinite. If the reverse bias at the collector to emitter junction is increased to the breakdown voltage $V_B$, the multiplication of minority carriers becomes essentially infinite. However, the voltage $V_1$ is selected close to the voltage $V_B$ because by increasing the reverse bias at the collector to base junction of the transistor 14, the area of accumulated electrons and holes widens to cause the rate of hole-electron production to increase. The bias $V_1$ is established at the collector of the transistor 14 by the potential at the positive terminal of the battery 70 minus the voltage drop caused by the steady state current $MI_{co}$ flowing through the resistor 68 to the transistor 14. The resistor 68 is selected with a relatively large value so that the current $MI_{co}$ is maintained at a minimum to prevent excessive power dissipation.

Figure 4:
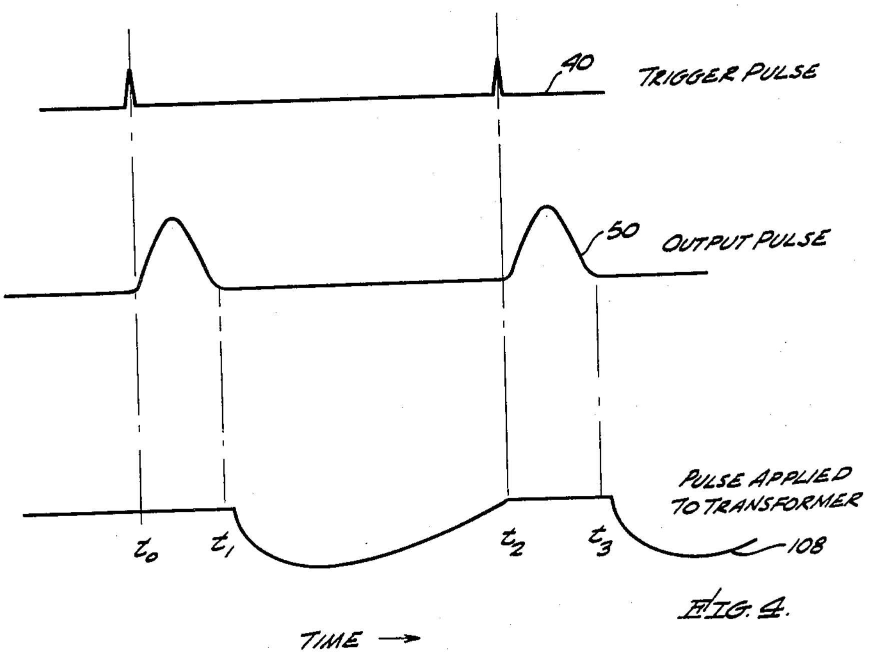
FIG. 4 is a schematic time diagram of waveforms showing the voltage of signals developed in the circuit of FIG. 1.

Now that the standby point 100 has been determined, the pulse forming operation in the negative resistance region will be further explained. The bias developed by the voltage divider 22, 26 maintains the transistor 14 at the standby condition at the point 100 which point is determined by the voltage $V_1$ applied to the collector of the transistor 14. The plates 34 and 56 of the capacitors 36 and 54 are thus positively charged. This voltage $V_1$ is maintained constant because an increase of $MI_{co}$ which is the transistor multiplication factor times the steady state current resulting for example from a temperature change varying the characteristics of the transistor 14, causes the operating point to move to the left which in turn provide a small decrease of $MI_{co}$ so that the operating point moves back to the right as an example of the operating voltages, the base of the grounded emitter transistor 14 may be biased at −1 volt and the voltage $V_1$ at the collector may be +40 volts. Upon the application to the base of the transistor 14 of a positive trigger pulse of the waveform 40 at time $t_0$ as shown in FIG. 4, the base to emitter junction of the transistor 14 is forward biased, allowing electrons to pass from the emitter into the base region to start the regenerative feedback action in the avalanche transistor. The operating point of the transistor 14 thus moves from the characteristics negative resistance curve 99 along the load line 98 to a characteristic negative resistance curve such as 102. After the avalanche breakdown and multiplication is initiated in the transistor 14, that operation is independent of the presence of the trigger signal of the waveform 40. Essentially a short circuit is present between the collector and emitter of the transistor 14 with the avalanche multiplication resulting from the high field strength at the base to collector junction thereof causing the current in the collector to be greater than the current in the emitter by the multiplication factor M. However, substantially all of the current that flows into the collector of the transistor 14 after time $t_0$ is obtained from the capacitors 36 and 54 which provide current limiting to prevent the transistor from being destroyed.

As the capacitors 36 and 54 discharge their current through transistor 14 the voltage at the lead 30 decreases to $V_s$ and may discharge to ground potential on the plates 34 and 56. Within the negative resistance region when the voltage on the lead 30 is between $V_B$ and $V_s$, the avalanche multiplication occurs moving along a characteristic line 102. When the trigger signal of the waveform 40 is removed from the base of the transistor 14, the operation may shift to another line such as a line 103. As the capacitors 36 and 54 discharge, transient load lines similar to the load line 104 are present in the negative resistance region, with the load line 104 generally moving to the left as the voltage at the lead 30 decreases. It is to be noted that with proper selection of the capacitors 36 and 54 the capacitors will discharge completely to ground potential. The stored carriers in the base regions maintain the transistor conductive in the normal operating region below the negative resistance region.

Thus, between times $t_0$ and $t_1$ the output pulse of the waveform 50 is developed by current flowing from the plate 42 of the capacitor 36 and through the load such as the load resistor 46. When the current sources of the capacitors 36 and 54 are discharged at time $t_1$, the output pulse of the waveform 50 is terminated.

Also, at time $t_0$ a pulse similar to the output pulse of the waveform 50 is developed on the lead 62 as a result of current passing from the plate 60 of the capacitor 54 to ground through the first winding 64 of the transformer 66, as shown by the waveform 80. The transistor 53 which operates in the switching mode is normally biased out of conduction. The pulse of the waveform 80 is applied through the transformer 66, being inverted therein, through the resistor 76 to the base of the transistor 53 with the inductance of the transformer 66, the resistance of the resistor 76 and the capacitance of the timing capacitor 84, as well as any capacitance between the base and emitter of the transistor 52, providing a predetermined time delay. This time delay is slightly greater than the width of the output pulse of the waveform 50 between times $t_0$ and $t_1$ so that recharging of the capacitors 36 and 54 occurs only at the termination of the output pulse. A short time after termination of the pulse of the waveform 50 is also provided after the time $t_1$ before recharging so that the transistor 14 may recover to its reverse biased base to emitter condition. The pulse applied to the base of the transistor 52 after the time delay is shown by a waveform 108 elongated in time because of the effect of the inductvie and capacitive elements developing the delay. Also, the pulse of the waveform 108 is inverted because of the polarity arrangement of the transformer 66. Thus, the switching transistor 52 shortly after time $t_1$ is biased into full conduction to apply current from its emitter to collector and simultaneously to the capacitors 36 and 54. Thus, the capacitors 36 and 54 are rapidly charged after time $t_1$ because essentially a short circuit is provided thereto from the positive terminal of the battery 70. It is to be noted that during the recharging period the voltage from the battery 52 is clamped by the diode 86 to prevent a positive voltage overshoot greater than the voltage $V_1$ which may damage the transistor 14. At a time $t_2$ the capacitors 36 and 54 are recharged and the transistor 53 is biased out of conduction so that the collector of the transistor 14 is held at the standby point 100 by the potential $V_1$.

The termination of the inverted pulse of the waveform 108 at the time $t_2$ allows the application of a second trigger pulse of the waveform 40 to the base of the transistor 14. It is to be noted that the time between $t_1$ and $t_2$ is relatively short compared to the time required to recharge the capacitors 36 and 54 through the resistor 68. At time $t_2$ the pulse forming operation is repeated with the formation of the output pulse of the waveform 50 being terminated at a time $t_3$.

The width of the output pulse of the waveform 50 is determined primarily by the characteristics of the transistor 14 and the value of the capacitors 36 and 54. Also, the amplitude of the output pulse of the waveform 50 is determined primarily by the value of the capacitors 36 and 54. However, by suitable selection of the storage capacitors 36 and 54 and of the transistor 14, output pulses may be provided with a desired width and with a desired amplitude.

Thus, a charging arrangement is provided for recharging the capacitors 36 and 54 during the interpulse period between the times $t_1$ and $t_2$ so that output pulses of the waveform 50 may be developed with a high repetition rate. At the same time the biasing resistor 68 is selected with a relatively large value so that the avalanche transistor 14 is operating at the desirable standby point 100 with a minimum of steady state current $MI_{co}$. Because the transistor 14 is triggered at its base, the pulses of the waveform 40 may be of a relatively low power.

When triggering from the emitter of the avalanche transistor with the arrangement of FIG. 2, the operation is similar except negative pulses of the waveform 94 are applied to the emitter of the transistor 14 for forward biasing the base to emitter junction to initiate the regenerative feedback action. The emitter triggering of FIG. 2 has the disadvantages that feedback of the output pulse to the source 92 is present and that pulses of the waveform 94 must be of a substantially greater power than with base triggering.

It is to be noted that the principles in accordance with this invention are not to be limited to the n-p-n type avalanche transistor 14 or to the p-n-p type switching transistor 52 as opposite types may be utilized by appropriately reversing the applied potentials. Also, it is to be understood that this invention is not limited to utilizing the avalanche transistor 14 in a grounded emitter arrangement by may also include a grounded collector arrangement which characteristically requires a floating bias potential be maintained at the base. Further, the invention is not to be limited to any particular triggering arrangement of the transistor 14.

Thus, there has been described a high repetition rate pulse generator utilizing an avalanche transistor that provides means to overcome the long time delay between pulses. The circuit in accordance with this invention has been operated at a 5 MC pulse repetition rate and indications are that a pulse rate up to 10 MC may be obtained. Because of the simplicity of a high repetition rate pulse generator utilizing avalanche transistors and responding to a narrow trigger pulse, the circuit has wide use in computers, for example.

What is claimed is:

1. A pulse generator responsive to a source of trigger pulses comprising a transistor having avalanche multiplication characteristics and having a base and first and second electrode with the base coupled to the source of trigger pulses and the first electrode coupled to a source of reference potential, a power source, an impedance coupled between the second electrode of said transistor and the said power source, a first and second capacitor coupled in parallel between the second electrode of said transistor and said source of reference potential, switching means having a control terminal and having a load current path coupled between the second electrode of said transistor and said power source, delay means coupled between said second capacitor and the control terminal of said switching means, and clamping means coupled to the second electrode of said transistor for limiting the potential, thereat, when said switching means is rendered conductive.

2. A high repetition rate pulse generator for applying output pulses to an output terminal in response to trigger signals comprising a first transistor having a control terminal responsive to the trigger signals and having a load current path, said first transistor having avalanche characteristics, a source of reference potential coupled to one end of said load current path, a power source including impedance means coupled to the other end of said load current path for biasing said first transistor in the avalanche region of operation, first and second capacitors each having a first plate coupled in parallel to one end of said load current path of said first transistor, said capacitors being charged by said power source and being discharged when said first transistor is rendered conductive in response to a trigger signal, said first capacitor having a second plate coupled to the output terminal for applying an output pulse thereto, a second transistor having a control terminal and having a load current paht coupled between said power source and the first plates of said capacitors, and delay means coupled between a second plate of said second capacitor and the control terminal of said second transistor for switching said second transistor into conduction to charge said capacitors at the termination of said output pulse.

3. A pulse generator with a short recovery time comprising a source of trigger signals, an avalanche transistor operating in the negative resistance region thereof having a base coupled to said source of trigger signals and having a first and a second electrode with the first electrode coupled to a source of reference potential, a first and a second capacitor coupled in parallel between the second electrode of said transistor and said source of reference potential, a power source, impedance means coupled between the second electrode of said transistor and said power source, switching means having a load current path and a control terminal with said load current path coupled from between the second electrode of said transistor and said second capacitor to said power source, and delay forming means coupled between the second electrode of said transistor and the control terminal of said switching means.

4. A pulse generator with short recovery time for applying output pulses to a load comprising a source of trigger pulses, a first transistor having a base coupled to said source of trigger pulses and having an emitter and a collector with the emitter coupled to a source of reference potential, said first transistor having an avalanche multiplication region, a first capacitor coupled between the collector of said first transistor and the load, a power source, a resistor coupled between the collector of said first transistor and said power source, said power source biasing said first transistor in the avalanche multiplication region, a second capacitor having a first and second plate with the first plate coupled to the collector of said first transistor, a second transistor having a base, and a first and second electrode with the first and second electrodes respectively coupled from between the collector of said first transistor and said second capacitor to said power source, delay means coupled between the second plate of said second capacitor and the base of said second transistor, and clamping means coupled to the collector of said first transistor for limiting the potential applied to the collector of said first transistor from said power source.

5. A high repetition rate pulse generator responding to a source of trigger signals to apply an output pulse to a load comprising a first transistor having a base coupled to the source of trigger signals and having a first and second electrode with the first electrode coupled to a source of reference potential, said transistor operating with avalanche characteristics to provide current multiplication between said first and second electrodes after initiation by said trigger signals, a first capacitor having a first and second plate coupled respectively between the second electrode of said first transistor and said load to apply the output pulse, thereto, a second capacitor having a first and second plate with the first plate coupled to the second electrode of said first capacitor, a power source, first impedance means coupled between the second electrode of said first transistor and said power source, second impedance means coupled between the second plate of said second capacitor and said source of reference potential, a second transistor having a base and having a first and a second electrode coupled between said power source and said second electrode of said first transistor, said second transistor operating in a switching mode, and a delay means coupled between said second impedance means and the base of said second transistor, said delay means providing a delay of pulses applied thereto substantially equal to the width of said output pulses to control said second transistor so as to couple said power source to said capacitors after the termination of said output pulse.

6. A high repetition rate pulse generator responding to trigger pulses from a source to apply output pulses to a load comprising a transistor having avalanche characteristics and having a base and a first and second electrode with the base coupled to the source of trigger pulses and the first electrode coupled to a source of reference potential, a source of power, impedance means coupled between the second electrode of said transistor and said source of power for maintaining said transistor normally biased in a characteristic negative resistance region thereof, a first capacitor coupled between the second electrode of said transistor and the load, a second capacitor having one end coupled to the second electrode of said transistor, switching means having a control terminal and having a load current path·coupled between said power source and the second electrode of said transistor, and delay producing means coupled between the other end of said second capacitor and said source of reference potential to the control terminal of said switching means, said first and second capacitors controlling current through said transistor after being initiated by the trigger pulses to apply the output pulses to said load and to apply pulses to said delay means for rapidly charging said capacitors at the termination of said output pulse.

7. A pulse generator responsive to a source of trigger pulses to apply output pulses to a load comprising a first and a second source of potential, an avalanche transistor having a base coupled to said source of trigger pulses, an emitter coupled to said first source of potential and having a collector, said transistor operating in a negative resistance region with the base to emitter path normally reverse biased, impedance means coupled between the collector of said transistor and said second source of potential, a first capacitor coupled between the collector of said transistor and the load, a second capacitor having one plate coupled to the collector of said transistor, signal forming means coupled between the other plate of said second capacitor and said first source of potential, switching means having a control terminal and having a load current path coupled between the collector of said transistor and said second source of potential, delay means coupled between said signal forming means and the control terminal of said switching means, and clamping means coupled to the collector of said transistor, whereby a pulse developed by current flowing through said transistor as said first and second capacitors are discharged is applied to said load as an output pulse and to said delay means for biasing said switching means into conduction to charge said first and second capacitors substantially at the termination of said output pulse, said clamping means limiting the potential at the collector of said transistor when said capacitors are being charged.

8. A high repetition rate pulse generator responding to trigger pulses from a source to apply output pulses to a load comprising a transistor having avalanche characteristics and having a base and a first and second electrode with the base coupled to the source of trigger pulses and the first electrode coupled to a source of reference potential, a source of power, impedance means coupled between the second electrode of said transistor and said source of power for maintaining said transistor biased in a characteristic negative resistance region thereof, a first capacitor coupled between the second electrode of said transistor and the load, a first clamping means coupled from between said first capacitor and said load to said source of reference potential to prevent oscillations of the output pulse, a second clamping means coupled to the second electrode of said transistor for limiting the potential thereat, a second capacitor coupled between the second electrode of said transistor and said source of reference potential, switching means having a control terminal and having a load current path coupled between said power source and the second electrode of said transistor, and delay producing means coupled between said second capacitor and said source of reference potential to the control terminal of said switching means, said first and second capacitors controlling current through said transistor after being initiated by the trigger pulse to apply an output pulse to said load and to apply a pulse to said delay means for rapidly charging said capacitors at the termination of said output pulse.

9. A high repetition rate pulse generator responsive to a source of trigger signals to apply pulses to a load comprising a first transistor with an avalanche breakdown region having negative resistance characteristics, said first transistor having a base coupled to the source of trigger signals and a first and a second electrode with the first electrode coupled to a source of reference potential, a first capacitor coupled between said second electrode and the load, a source of power, impedance means coupled between the second electrode of said first transistor and said source of power, a second transistor having a first and a second electrode coupled respectively between the second electrode of said first transistor and said source of power, a second transistor having a first and a second electrode coupled respectively between the second electrode of said first transistor and said source of power and having a base, a second capacitor having one plate coupled to the first electrode of said second transistor, a transformer coupled between the other plate of said second capacitor and a timing resistor coupled between said source of reference potential, said transformer and the base of said second transistor, a third capacitor coupled between the base of said second transistor and said source of power, and clamping means coupled to the second electrode of said first transistor, whereby in response to a trigger signal pulse is applied to said load as said first and second capacitors are discharged and said second transistor responds substantially at the termination of each pulse to rapidly recharge said first and second capacitors with said clamping means limiting the potential of said source of power at the second electrode of said first transistor.

10. A high repetition rate pulse generator responding to trigger pulses from a source to apply output pulses to a load comprising a transistor having avalanche characteristics and having a base and a first and second electrode with the base coupled to a source of biasing potential and the first electrode coupled to a source of reference potential and to the source of trigger pulses, a source of power, impedance means coupled between the second electrode of said transistor and said source of power for maintianing said transistor biased in a characteristic negative resistance region thereof, a first capacitor coupled between the second electrode of said transistor and the load, a second capacitor coupled between the second electrode of said transistor and said source of reference potential, switching means having a control terminal and having a load current path coupled between said power source and the second electrode of said transistor, delay producing means coupled from between said second capacitor and said source of reference potential to the control terminal of said switching means, and clamping means coupled to the second electrode of said first transistor, said first and second capacitors controlling current through said transistor after being initiated by a trigger pulse to apply the output pulse to said load and to apply pulses to said delay means for rapidly charging said capacitors at the termination of said output pulse.

No references cited.